United States Patent
Candler et al.

(10) Patent No.: US 10,594,323 B2
(45) Date of Patent: Mar. 17, 2020

(54) LOCKED LOOP CIRCUIT AND METHOD WITH DIGITALLY-CONTROLLED OSCILLATOR (DCO) GAIN NORMALIZATION

(71) Applicant: Movellus Circuits Incorporated, Ann Arbor, MI (US)

(72) Inventors: Frederick Christopher Candler, Toronto, OH (US); Jeffrey Fredenburg, Ann Arbor, MI (US)

(73) Assignee: Movellus Circuits, Inc., Ann Arbor, MI (US)

( * ) Notice: Subject to any disclaimer, the term of this patent is extended or adjusted under 35 U.S.C. 154(b) by 35 days.

(21) Appl. No.: 16/006,927

(22) Filed: Jun. 13, 2018

(65) Prior Publication Data

US 2019/0386663 A1    Dec. 19, 2019

(51) Int. Cl.
*H03L 1/00* (2006.01)
*G04F 10/00* (2006.01)
*H03L 7/099* (2006.01)

(52) U.S. Cl.
CPC .............. *H03L 1/00* (2013.01); *G04F 10/005* (2013.01); *H03L 7/0991* (2013.01)

(58) Field of Classification Search
CPC ....................................................... H03L 1/00
USPC ........................................................ 331/18
See application file for complete search history.

(56) References Cited

U.S. PATENT DOCUMENTS

| | | |
|---|---|---|
| 5,999,060 A | 12/1999 | Zuta |
| 6,218,876 B1 | 4/2001 | Sung |
| 6,275,553 B1 | 8/2001 | Esaki |
| 6,424,192 B1 | 7/2002 | Lee |
| 6,496,965 B1 | 12/2002 | van Ginneken |
| 6,744,324 B1 | 6/2004 | Adams |
| 6,826,247 B1 | 11/2004 | Elliott |
| 7,216,249 B2 | 5/2007 | Fujiwara |
| 8,117,576 B2 | 2/2012 | Mossawir |
| 8,321,489 B2 | 11/2012 | Staszewski |
| 8,427,205 B1 | 4/2013 | Nagaraj |
| 8,791,734 B1 | 7/2014 | Hara |
| 2005/0189972 A1 | 9/2005 | Foo |
| 2007/0085622 A1* | 4/2007 | Wallberg ................. H03L 7/093 331/179 |
| 2010/0244971 A1* | 9/2010 | Wang .................... G04F 10/005 331/1 A |
| 2013/0120036 A1 | 5/2013 | Zhu |

(Continued)

*Primary Examiner* — Joseph Chang
(74) *Attorney, Agent, or Firm* — Lance Kreisman; Peninsula Patent Group

(57) ABSTRACT

A locked-loop circuit includes a time-to-digital converter (TDC) having a reference clock input and an error input. A digital loop filter receives an output from the TDC representing a difference between the reference clock input and the error input. A digitally-controlled oscillator (DCO) receives an output from the digital filter in the form of output bits. The DCO has a codeword gain associated with a DCO control word. The codeword gain is applied to the output bits received from the digital loop filter. Calibration logic determines a scaling factor based on a process-voltage-temperature (PVT) operating characteristic. The scaling factor is applied to normalize an actual DCO codeword gain to the codeword gain. The DCO includes an output to deliver an output timing signal having a frequency based on the scaling factor.

18 Claims, 2 Drawing Sheets

(56) References Cited

U.S. PATENT DOCUMENTS

2013/0300477 A1 11/2013 Ueda
2016/0036454 A1 2/2016 Moehlmann
2016/0204787 A1 7/2016 Lotfy
2017/0193136 A1 7/2017 Prasad \* cited by examiner

LOCKED LOOP CIRCUIT AND METHOD WITH DIGITALLY-CONTROLLED OSCILLATOR (DCO) GAIN NORMALIZATION

TECHNICAL FIELD

The disclosure herein relates to locked loop circuits, and more particularly digital locked-loop circuits with adjustable parameters in response to changing environmental conditions.

BACKGROUND

Locked loop circuits, such as phase-locked loops, typically generate timing signals relative to an input reference signal. The locked loop circuitry adjusts the frequency of an output signal based on frequency and/or phase differences between the reference signal and the output signal. Based on any such difference, the frequency and/or phase of the output signal is increased or decreased accordingly. Phase-locked loops are used in a wide range of electronics, such as radios, telecommunication circuits, wireless and mobile devices, computers, and other devices.

Digital phase-locked loops often employ a digitally-controlled oscillator (DCO) that converts an input digital word received from a loop filter into a periodic signal output at a given frequency. Conventional DCO circuits generate the periodic output based on a multi-bit DCO codeword that acts as a function applied to the input digital word from the loop filter. Under various operating conditions, such as those involving process, voltage or temperature (PVT) variations, the DCO codeword may exhibit gain variation, consequently introducing error in the frequency and/or phase of the output signal.

Accordingly, what is needed are methods, systems and associated apparatus that allow for compensating for DCO gain variations in a straightforward, efficient and predictable manner.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of locked-loop circuits and methods are provided. In one embodiment, a locked-loop circuit includes a time-to-digital converter (TDC) having a reference clock input and an error input. A digital loop filter receives an output from the TDC representing a difference between the reference clock input and the error input. A digitally-controlled oscillator (DCO) receives an output from the digital filter in the form of output bits. The DCO has a codeword gain associated with a DCO control word. The codeword gain is applied to the output bits received from the digital loop filter. Calibration logic determines a scaling factor based on a process-voltage-temperature (PVT) operating characteristic. The scaling factor is applied to normalize an actual DCO codeword gain to the codeword gain. The DCO includes an output to deliver an output timing signal having a frequency based on the scaling factor. Having the ability to normalize the codeword gain by a determined scaling factor enhances locked-loop performance while allowing for reduced footprint characteristics and ensuring that the circuit operates correctly for all PVT conditions.

Figure 1:
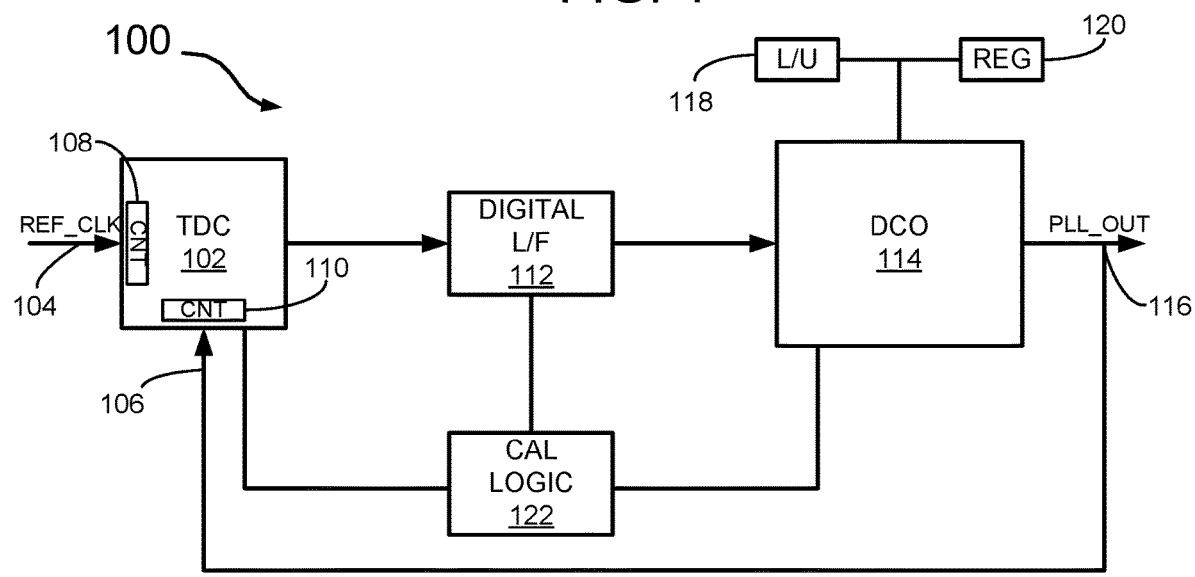
FIG. 1 illustrates one embodiment of a digital phase-locked loop (PLL).

FIG. 1 illustrates one embodiment of a digital phase-locked loop (PLL), generally designated 100, that may be used to generate a desired output timing signal, such as a clock signal. The PLL includes a time-to-digital converter (TDC) 102 that receives a periodic reference clock signal REF_CLK, at 104, and a PLL output signal PLL_OUT, at 106. Each of the clock input signals are sampled by respective counter circuits 108, 110, which generate digital count values corresponding to the input signal frequencies. The TDC further includes comparison circuitry (not shown) that compares the frequency counts from the two counters, and generates a difference count value in the form of a multi-bit digital word.

With continued reference to FIG. 1, a digital loop filter 112 receives the output digital word from the TDC 102, and applies one or more digital filtering techniques to smooth the digital word. For one embodiment, explained more fully below, a scaling factor is applied to respective integral Ki and proportional Kp gain constants associated with the digital loop filter processing circuitry. The output of the digital loop filter is then fed to a digitally-controlled oscillator (DCO) 114.

Further referring to FIG. 1, the DCO 114 generally serves as a digital-to-frequency converter, receiving the smoothed digital output word from the loop filter 112, and applying a DCO codeword to the loop-filtered bits. The DCO codeword provides a gain, in frequency terms, that is applied to the smoothed loop-filtered output word. A periodic output signal is produced by, for example, a crystal oscillator, based on the value of the digital word resulting after application of the DCO codeword, and provided to an output node, at 116. The output timing signal PLL_OUT is then fed back to the TDC 102 to complete a control loop, and may also be distributed to other circuits needing a clock signal. Local storage may be provided to the DCO in the form of registers 118 and 120 to, for example, provide look-up table functionality and/or initial settings for DCO operation.

With continued reference to FIG. 1, for one embodiment, the PLL 100 employs calibration circuitry 122 in the form of logic to manage DCO gain normalization operations, and to provide beneficial frequency and phase initialization operations, each of which are more fully described below.

Figure 2:
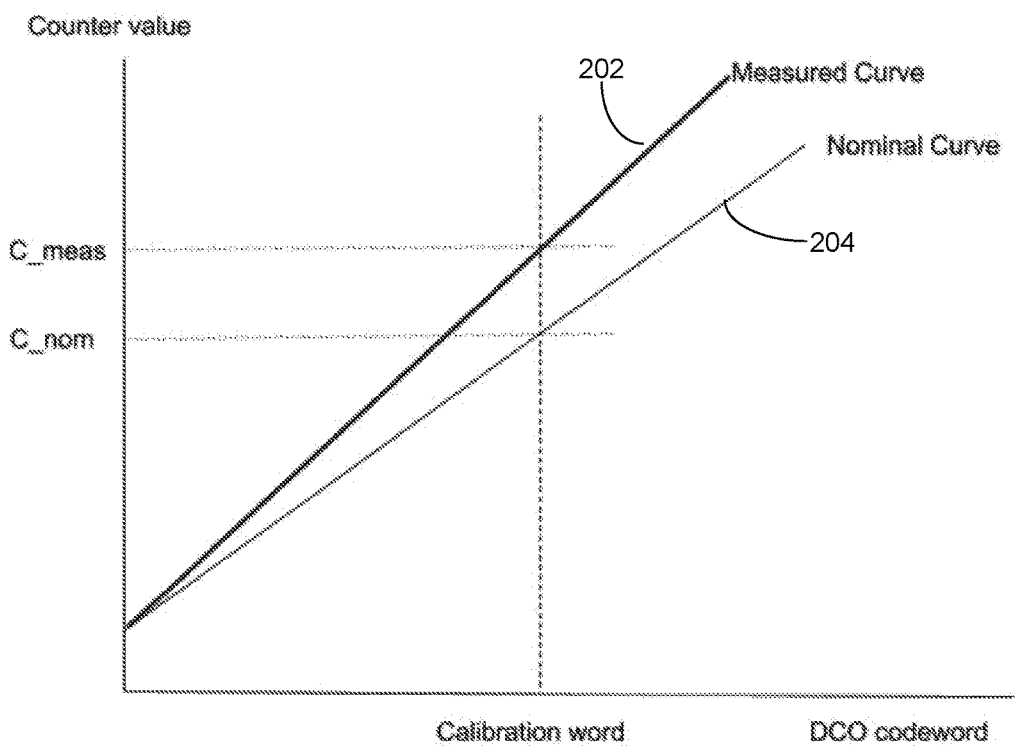
FIG. 2 illustrates a graph plotting a measured DCO gain versus a nominal DCO gain.

In some situations, an expected gain resulting from application of the DCO codeword differs significantly from an actual gain. FIG. 2 illustrates respective nominal and measured curves, at 202 and 204, that plot digital count values (y-axis), against codeword values (x-axis). In order to compensate for the change in operation due to, for example, process-voltage-temperature (PVT) effects, a DCO gain normalization process may be performed, as explained below.

Generally, for one embodiment, the DCO gain normalization process determines a run-time scaling factor, $K_{scale}$, that may be applied to the PLL loop filter gain constants, $K_i$ and $K_p$, to map them to a nominal DCO gain that was used at design-time for the PLL. This mapping of the run-time constants to the nominal gain, eliminates or significantly reduces the gain variation associated with PVT (process, voltage, and temperature). The DCO gain normalization may be simplified based upon the following assumptions:

i) The gain curves are linear, or approximately linear.
ii) Being within a predefined percentage of error is acceptable.
iii) That the minimum counter value for all gain curves can be approximated to being the same without a significant loss in accuracy. For some applications, targeting a maximum normalization error of 15% is acceptable. However, since the normalization is a direct calculation, the normalization error will be much less, i.e. less than 5%.

More specifically, the counter value generated by the PLL output counter 110 (FIG. 1) in the TDC 102 is sampled on successive reference clock cycles. The number of cycles that the counter has advanced in a single reference clock cycle tells us the frequency of the DCO output clock relative to the reference clock. By comparing this counter value to the nominal, i.e. expected, counter value, the gain of the DCO may be inferred and thereby normalized relative to the nominal DCO gain. In an open loop mode, the counter value is constant and is equal to:

count=output frequency/input frequency (e.g. 4 GHz/ 25 MHz=160)

Or equivalently:

count=DCO gain*DCO/input frequency

Further, the count value may be viewed as equivalent to a frequency control word, FCW, that is used in a closed loop mode. The FCW is often defined by a setting in the DCO register, such as at 120, whereas in the calibration the FCW is determined by the DCO setting. As a result, the relationship above becomes:

$FCW_{cal}=DCOgain_{nom}*DCO_{cal}$/input frequency (1)

The nomenclature "FCW" instead of "counter" is thus used in the following discussion for clarity purposes, especially in a context involving frequency acquisition, more fully discussed below. Additionally, the input frequency may be represented as $F_{ref}$/FCWDIV, where FCWDIV defines the external frequency division value that divides down the input reference frequency. The relationship then becomes:

$FCW_{cal}=DCOgain_{nom}*DCO_{cal}*FCWDIV_{cal}/F_{ref}$

In the above equation, all variables are known except for $DCOgain_{nom}/F_{ref}$ which is used to perform the calibration, so it may be supplied by a run-time register variable stored in, for example, the register storage 120.

Prior to normalization, the inherent speed of the silicon chip that forms the PLL circuitry is unknown. To prevent generating DCO frequencies that are out of range of the circuit, PVT variations should be accounted-for when choosing the $DCO_{cal}$ value. For some embodiments, using the largest possible $DCO_{cal}$ value minimizes normalization error. However, equally important is the desire to minimize timing violations during normalization. One embodiment provides for up to 8×PVT variation in the DCO gain range. The calibration logic 122 (FIG. 1) assumes that the PLL circuit has closed timing at the FCW value specified at run-time, or is an operationally safe value. The $DCO_{cal}$ value is iteratively set and then checked to see if the associated $FCW_{measured}$ value is less than the FCW value specified at run-time. This tells us that we are driving the DCO and therefore the DCO clock at close to the expected frequency for the application, but not exceeding the application frequency and therefore are not generating unexpected timing violations. This search function determines the DCO codeword value that we used during calibration, $DCO_{cal}$.

After determining an optimal DCO calibration codeword, and utilizing the calibration setting, the $FCW_{cal}$ value is measured to match the nominal gain based upon equation (1) above. However, due to the PVT variation, a different counter value is measured, called $FCW_{measured}$. The $K_{scale}$ variable may then be represented as:

$K_{scale}=FCW_{measured}/FCW_{cal}$

A straightforward lookup table stored in storage 118 may be employed for the 1/X relationship exhibited by the above equation, while other implementations for 1/X may be logic based. Note that the $K_{scale}$ variable is specific to the DCO gain in the system, so even if the FCWDIV variable is changed, the $K_{scale}$ value does not change.

For one embodiment, to minimize the PLL lock time, the approximate DCO codeword is determined when the PLL is locked, represented by the variable $DCO_{acq}$, and the output DCO clock phase is set to match the input phase. The DCO setting for frequency acquisition is calculated by scaling the DCO codeword setting that was found in normalization. The scaling accounts for the PVT variation, $K_{scale}$ and the different operating frequency defined by the variable $FCW_{acq}$. The DCO acquisition value may be determined via the following relationship:

$DCO_{acq}=1/K_{scale}*FCW_{acq}/FCW_{cal}*FCWDIV_{cal}/FCWDIV_{acq}*DCO_{cal}$

By using the same FCWDIV value for both the calibration and acquisition and substituting for $K_{scale}$, the following expression may be derived:

$DCO_{acq}=FCW_{cal}/FCW_{measured}*FCW_{acq}/FCW_{cal}*DCO_{cal}$

Which simplifies to:

$DCO_{acq}=FCW_{acq}/FCW_{measured}*DCO_{cal}$

In the above equation, $FCW_{acq}$ is the user's operational FCW value, so this is a straightforward calculation but requires the same 1/X calculation that was used previously.

Generally, in most cases, a user will calibrate with the same FCWDIV as during the frequency acquisition. If this is not the case, then an additional scale factor should be added during frequency acquisition to account for the change in FCWDIV:

$DIV_{scale}=FCWDIV_{cal}/FCWDIV_{acq}$

Using this additional scale factor, we get:

$DCO'_{acq}=DIV_{scale}*DCO_{acq}$

Figure 3:
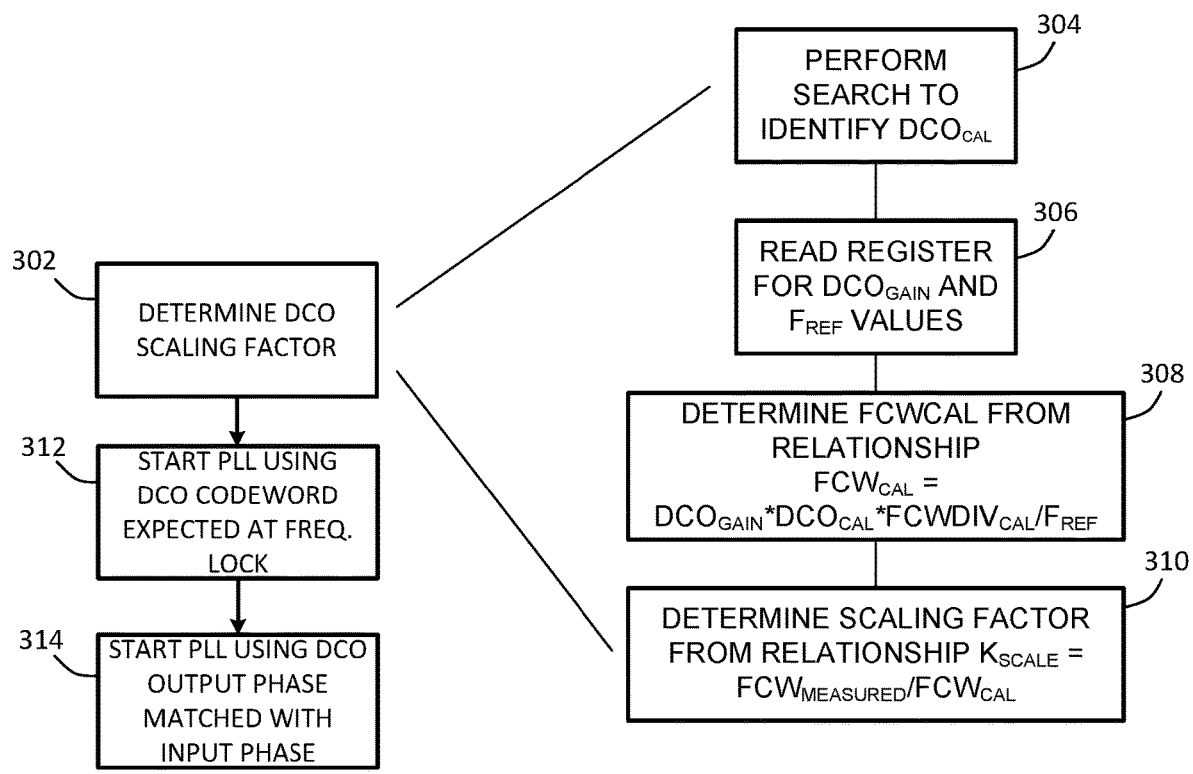
FIG. 3 illustrates a flowchart of steps illustrating one embodiment of a method of operating a PLL such as that shown in FIG. 1.

FIG. 3 illustrates a flowchart of a method of operating the locked-loop circuit described above, and summarizes many of the method steps employed. Prior to operating the circuit in a run-time mode of operation, calibration operations are carried out to determine a DCO scaling factor, at 302. As explained above, the DCO scaling factor provides a way to normalize the DCO codeword gain such that changes to the gain due to PVT effects may be compensated. Determining the scaling factor first involves performing the calibration search to identify $DCO_{cal}$, at 304. Predefined variables may then be read from register storage, such as $DCO_{gain}$ and $F_{ref}$ values, at 306. The variable FCWCAL may then be determined, at 308, followed by determining the scaling factor $K_{scale}$, at 310.

For one embodiment, and with continued reference to FIG. 3, to achieve ultra-fast PLL lock, the PLL loop-filter is set with both a frequency and phase that are very close to the locked frequency and phase. To minimize the initial phase error, the initial phase of the DCO is set to the same phase, or approximately the same phase, as the input clock reference signal. The DCO phase counter is set to match the phase of the input reference clock signal. Since the DCO counter value is literally set to match, or close to matching, the input reference clock signal phase, there is almost no phase locking required by the PLL. By calculating the DCO acquisition codeword, and by setting the DCO counter phase, the PLL may be started in an "almost locked" state which greatly reduces the PLL lock time.

As explained above, the approximate locked PLL frequency is pre-determined and used to start the PLL, at 312, and the DCO started at an almost zero phase error relative to the reference clock, at 314. Mechanically, this means that we set the DCO codeword to $DCO_{acq}$ and set the DCO phase to match the phase of the reference clock. Simulations indicate that we can lock in less than 30 reference clock cycles, whereas without this acquisition logic the lock time is approximately 90 reference clock cycles with our digital implementation. Most other PLL design implementations lock in many hundreds of clock cycles.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A locked-loop circuit, comprising:
   a time-to-digital converter (TDC) having a reference clock input and an error input;
   a digital loop filter to receive an output from the TDC representing a difference between the reference clock input and the error input;
   a digitally-controlled oscillator (DCO) to receive a digital value from the digital loop filter, the DCO to generate a periodic signal in response to the digital value, the DCO having an anticipated DCO gain representing change in the digital value versus change in a frequency exhibited by the periodic signal;
   calibration logic operative during a calibration mode of operation to measure an actual DCO gain and to determine a scaling factor based on a ratio of the measured actual DCO gain to the anticipated DCO gain, the scaling factor utilized during a run-time mode of operation to normalize the actual DCO gain to the anticipated DCO gain; and
   storage to store a value representing the sealing factor, wherein the scaling factor is retrievable from the storage prior to the run-time mode of operation.

2. The locked-loop circuit according to claim 1, wherein the digital loop filter operates in accordance with at least one loop filter constant, and wherein the scaling factor is applied to the at least one loop filter constant.

3. The locked-loop circuit according to claim 2, wherein the at least one loop filter constant comprises a proportional gain constant Kp.

4. The locked-loop circuit according to claim 1, wherein the at least one filter constant further comprises an integral gain constant Ki.

5. The locked-loop circuit according to claim 1, embodied as a phase-locked loop (PLL) circuit.

6. The locked-loop circuit according to claim 1, wherein the TDC further comprises:
   a counter disposed at the error input to receive the DCO output timing signal, and to increment a count value in response to each cycle of the periodic signal;
   comparison circuitry to compare the incremented count value to an expected count value and generate a difference value; and
   wherein the scaling factor is based on the difference value.

7. The locked-loop circuit according to claim 6, wherein:
the scaling factor is further based on a calibration digital value determined during a calibration search routine.

8. The locked-loop circuit according to claim 6, wherein:
the counter includes a programmable input for initializing a phase of the periodic signal to match a phase of an input reference clock signal received at the reference clock input.

9. A method of operation in a locked-loop circuit, comprising:
comparing an input reference timing signal to an output timing signal from a digitally-controlled oscillator (DCO) to create a difference value, and converting the difference value to a digital value;
digitally filtering the digital value with a digital loop filter to generate filtered output bits representing a digital value;
receiving the filtered output bits with the DCO, the DCO to generate the output timing signal in response to the received filtered output bits, the DCO having an anticipated DCO gain representing change in the digital value versus change in the output timing signal;
during a calibration mode of operation,
measuring an actual DCO gain,
determining a scaling factor based on a ratio of the measured actual DCO gain to the anticipated DCO gain, and
storing a value representing the scaling factor in storage; and
during a run-time mode of operation,
retrieving the stored value to normalize the actual DCO gain to the anticipated DCO gain.

10. The method of claim 9, wherein the digitally filtering operates in accordance with at least one loop filter constant, and wherein applying the scaling factor comprises applying the scaling factor to the at least one loop filter constant.

11. The method of claim 10, wherein the at least one loop filter constant comprises a proportional gain constant Kp.

12. The method of claim 11, wherein the at least one loop filter constant further comprises an integral gain constant Ki.

13. The method of claim 9, further comprising:
receiving the DCO output timing signal;
incrementing a count value in response to each cycle of the DCO output timing signal;
determining an actual change in the count value during a period of the input reference timing signal;
comparing the actual change in the count value to an expected change in the count value and generating a value representing a ratio between the actual change in the count value to the expected chance in the count value.

14. The method of claim 9, wherein:
the scaling factor is further based on a digital calibration value determined during a calibration search carried out during the calibration mode of operation.

15. The method of claim 14, wherein the calibration search includes:
setting the digital calibration value to a first value;
applying the first value to the DCO;
measuring an output characteristic of a resulting output signal; and
iteratively repeating the setting and measuring until the output characteristic is within a predefined error threshold.

16. A digitally-controlled oscillator circuit for use in a locked-loop circuit, comprising:
a digitally-controlled oscillator (DCO) to receive a digital value from a digital loop filter, the DCO to generate a periodic signal in response to the digital value; the DCO having an anticipated DCO gain representing change in the digital value versus change in the periodic signal;
calibration logic operative during a calibration mode of operation to measure an actual DCO gain and to determine a scaling factor based on the measured actual DCO gain, the scaling factor utilized during a run-time mode of operation to normalize loop filter coefficients to match the anticipated DCO gain; and
storage to store a value representing the scaling factor, wherein the scaling factor is retrievable from the storage prior to the run-time mode of operation.

17. The digitally-controlled oscillator circuit of claim 16, wherein the scaling factor is applied to the loop filter coefficients.

18. The digitally-controlled oscillator circuit of claim 17, wherein the scaling factor is further based on a digital calibration value determined during a calibration search routine.

* * * * *